United States Patent
Wan et al.

(10) Patent No.: US 8,710,811 B2
(45) Date of Patent: Apr. 29, 2014

(54) VOLTAGE REGULATOR WITH IMPROVED VOLTAGE REGULATOR RESPONSE AND REDUCED VOLTAGE DROP

(75) Inventors: Yuan Zhong Wan, Boise, ID (US); Dong Pan, Boise, ID (US)

(73) Assignee: Nan Ya Technology Corporation, Tao-Yuan Hsien (TW)

( * ) Notice: Subject to any disclaimer, the term of this patent is extended or adjusted under 35 U.S.C. 154(b) by 255 days.

(21) Appl. No.: 13/342,426

(22) Filed: Jan. 3, 2012

(65) Prior Publication Data
US 2013/0169251 A1    Jul. 4, 2013

(51) Int. Cl.
    *G05F 1/575*        (2006.01)
(52) U.S. Cl.
    USPC ............................................... 323/280
(58) Field of Classification Search
    CPC .............................................. H02M 2001/0025
    USPC ..................................................... 323/280, 273
    See application file for complete search history.

(56) References Cited

U.S. PATENT DOCUMENTS 7,248,025 B2 *  7/2007  Adachi ........................ 323/273
7,821,238 B1 *  10/2010 Li .................................. 323/224

\* cited by examiner

*Primary Examiner* — Harry Behm
(74) *Attorney, Agent, or Firm* — Morris, Manning & Martin, LLP; Juan Carlos A. Marquez

(57) ABSTRACT

A voltage regulator includes an output drive device configured to provide an output voltage to an output terminal; an error amplifier configured to control the output drive device by taking into consideration a feedback signal from the output voltage; a first compensation unit configured to provide a first compensation signal to compensate an output signal of the error amplifier; and a second compensation unit configured to provide a second compensation signal to compensate an input signal of the error amplifier, wherein second compensation unit comprises at least two capacitors and at least one transistor configured to control the coupling of the two capacitors.

7 Claims, 3 Drawing Sheets

VOLTAGE REGULATOR WITH IMPROVED VOLTAGE REGULATOR RESPONSE AND REDUCED VOLTAGE DROP

BACKGROUND OF THE INVENTION

1. Technical Field

The present invention relates to a voltage regulator, and more particularly, to a voltage regulator with improved voltage regulator response and reduced voltage drop.

2. Background

Linear voltage regulator integrated circuits are widely used in electronic systems, particularly in applications which require power supplies with low noise and low ripple. In a DRAM (Dynamic Random Access Memory), LDO regulators supply power to the array peripheral such as data path, pumps to other noise-sensitive analog circuit blocks.

In a traditional voltage regulator, response time and voltage drop affect the performance of the voltage regulator. A faster response time can regulate voltage more quickly, while a lower voltage drop can reduce the ripple of the output voltage. Extra feedback resistors and feedback capacitors improve device performance. However, in a low power device, the voltage regulator needs to enter the power down mode in order to save power. Switching between an enable mode and a non-enable mode is important for the voltage regulator. The previous design, which attempted to improve the response time and voltage drop of the voltage regulator, required extra power dissipation and large layout size. Extra resistors and capacitors will increase the layout area. In addition, the resistors and capacitors require different settings for the enable mode and the non-enable mode. To address the above-mentioned shortcomings, the traditional voltage regulator design needs an improvement for feedback compensation.

In a DRAM device, voltage regulators are traditionally turned off during periods of low current demand such as power down and bank idle, and are turned on during active read/write. During power down, when there is no current demand, almost all the voltage regulators are turned off except a standby voltage regulator, which has slow response because of the small bias current to save power. However, when moving out of the power down mode, a large current demand appears, and all the voltage regulators are turned on in response to the large current load. With the process scaling down, the DRAM transfers from DDR to DDR2 and DDR3 and the supply voltage reduces from 2.5V to 1.5V, even 1.35V, then the voltage regulator response reduces linearity with the supply voltage change The result is significantly reduced frequency response and switching speed of the CMOS amplifier. Therefore, there is a need to improve the time response of the present voltage regulator.

SUMMARY

One aspect of the present invention provides a voltage regulator with improved voltage regulator response and reduced voltage drop.

In one embodiment of the present invention, a voltage regulator comprises an output drive device configured to provide an output voltage to an output terminal; an error amplifier configured to control the output drive device by taking into consideration a feedback signal from the output voltage; a first compensation unit configured to provide a first compensation signal to compensate an output signal of the error amplifier; and a second compensation unit configured to provide a second compensation signal to compensate an input signal of the error amplifier, wherein second compensation unit comprises at least two capacitors and at least one transistor configured to control the coupling of the two capacitors.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 1:
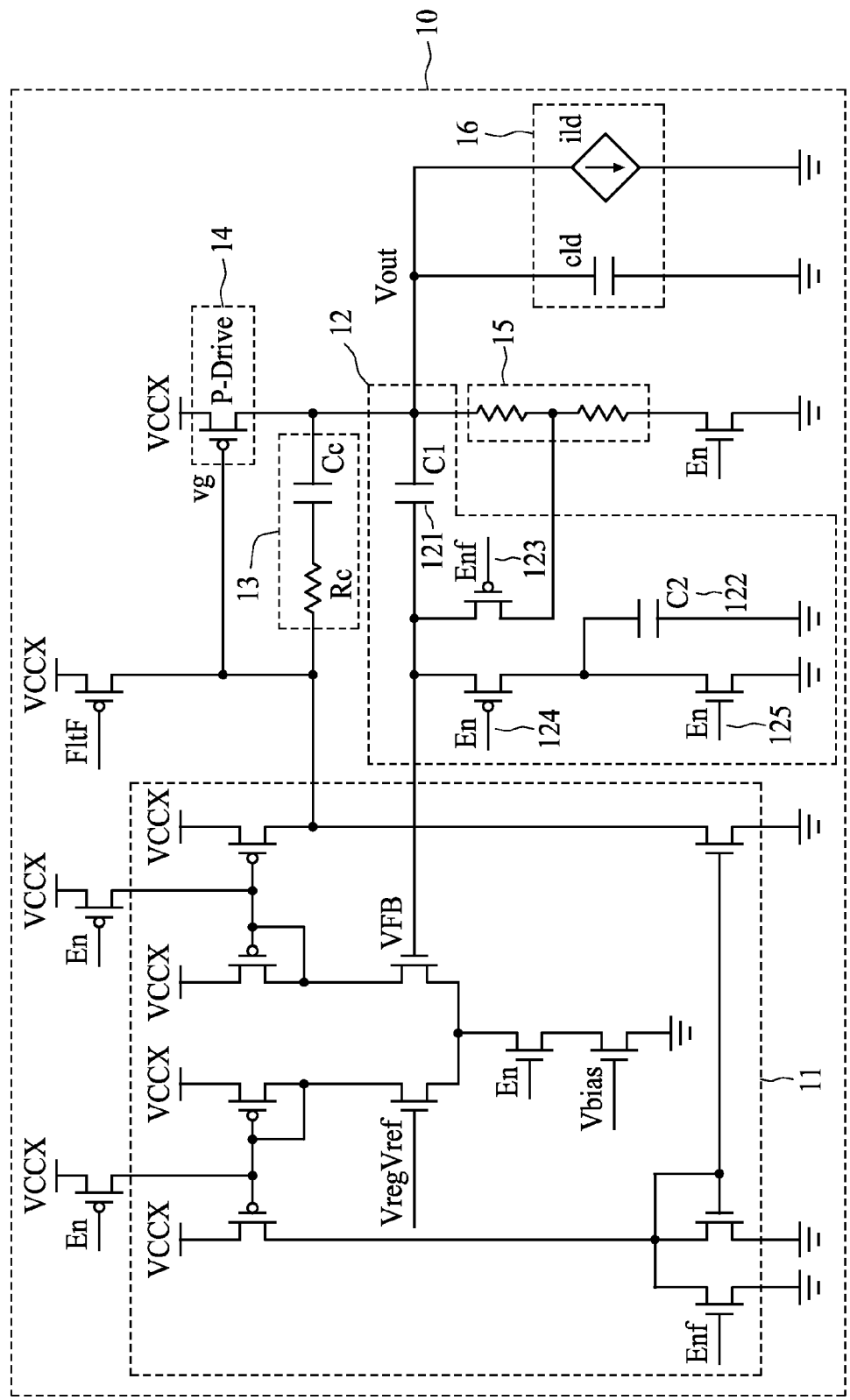
FIG. 1 shows a voltage regulator with improved response and faster correction of the feedback signal according to one embodiment of the present invention.

FIG. 1 shows a voltage regulator 10 for compensating the frequency response and reducing the voltage drop according to one embodiment of the present invention. As shown in FIG. 1, the voltage regulator 10 comprises an output drive device 14 configured to provide an output current and an output voltage to an output terminal Vout to where a load 16 is connected. The voltage regulator 10 further comprises an error amplifier 11 configured to control the output drive device 14 by taking into consideration a feedback signal from the output voltage.

The error amplifier 11 can be a differential amplifier or an operational transconductance amplifier (OTA). The OTA has an input terminal connected to a reference-voltage source VregRef, which supplies a constant bandgap voltage, an input terminal VFB coupled to an output terminal of the output drive device 14, and an output terminal Vout, which supplies a regulated voltage to an input terminal of the output drive device 14.

The voltage regulator 10 further comprises a first compensation unit 13, which includes a resistor Rc and a capacitor Cc in series, configured to provide a first compensation signal to compensate an output signal of the error amplifier 11.

The voltage regulator 10 further comprises a second compensation unit 12 including a first capacitor 121 connecting the output terminal of the output drive device 14 and an input terminal of the error amplifier 11, and a first transistor 124 configured to couple a second capacitor 122 to the input terminal of the error amplifier 11 during a non-enable mode. The second compensation unit 12 further comprises a voltage divider 15 configured to divide the output voltage into a feedback voltage during an enable mode, and a second transistor 123 configured to couple the feedback voltage to the input terminal of the error amplifier 11. The second compensation unit 12 further comprises a third transistor 125 configured to couple the second capacitor 122 to the ground during the enable mode. In one embodiment of the present invention, the transistors of the second compensation unit 12 are turned on and off to switch between the enable mode and the non-enable mode, the first transistor 124 and the second transistor 123 operate complementarily, and the first transistor 124 and the third transistor 125 operate complementarily.

Figure 2:
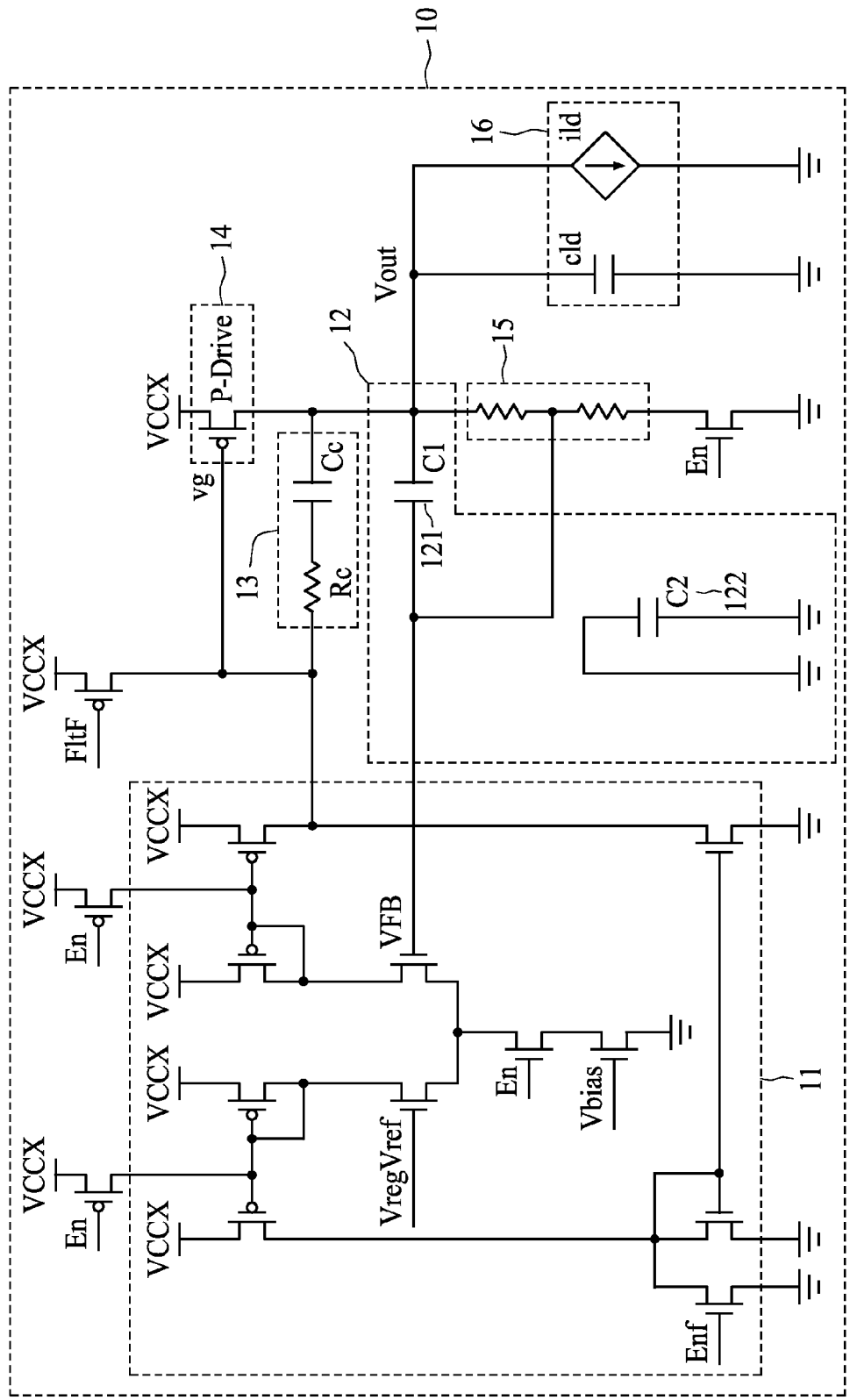
FIG. 2 shows an equivalent circuit of the voltage regulator during the enable mode according to another embodiment of the present invention.

FIG. 2 shows an equivalent circuit of the voltage regulator 10 during the enable mode according to another embodiment of the present invention. As shown in FIG. 2, during the enable mode, the second transistor 123 and the third transistor 125 are turned on, and the first transistor 124 is turned off. During the enable mode, the voltage divider 15 divides the output voltage Vout between resistor 151 and resistor 152 and feeds back the divided voltage to the input terminal VFB of the error amplifier 11, in parallel with the first capacitor 121. The enable mode can improve the continue response and reduce the voltage drop using the feedback of the voltage divider 15 and the first capacitor 121. This reduces the Miller Effect.

Figure 3:
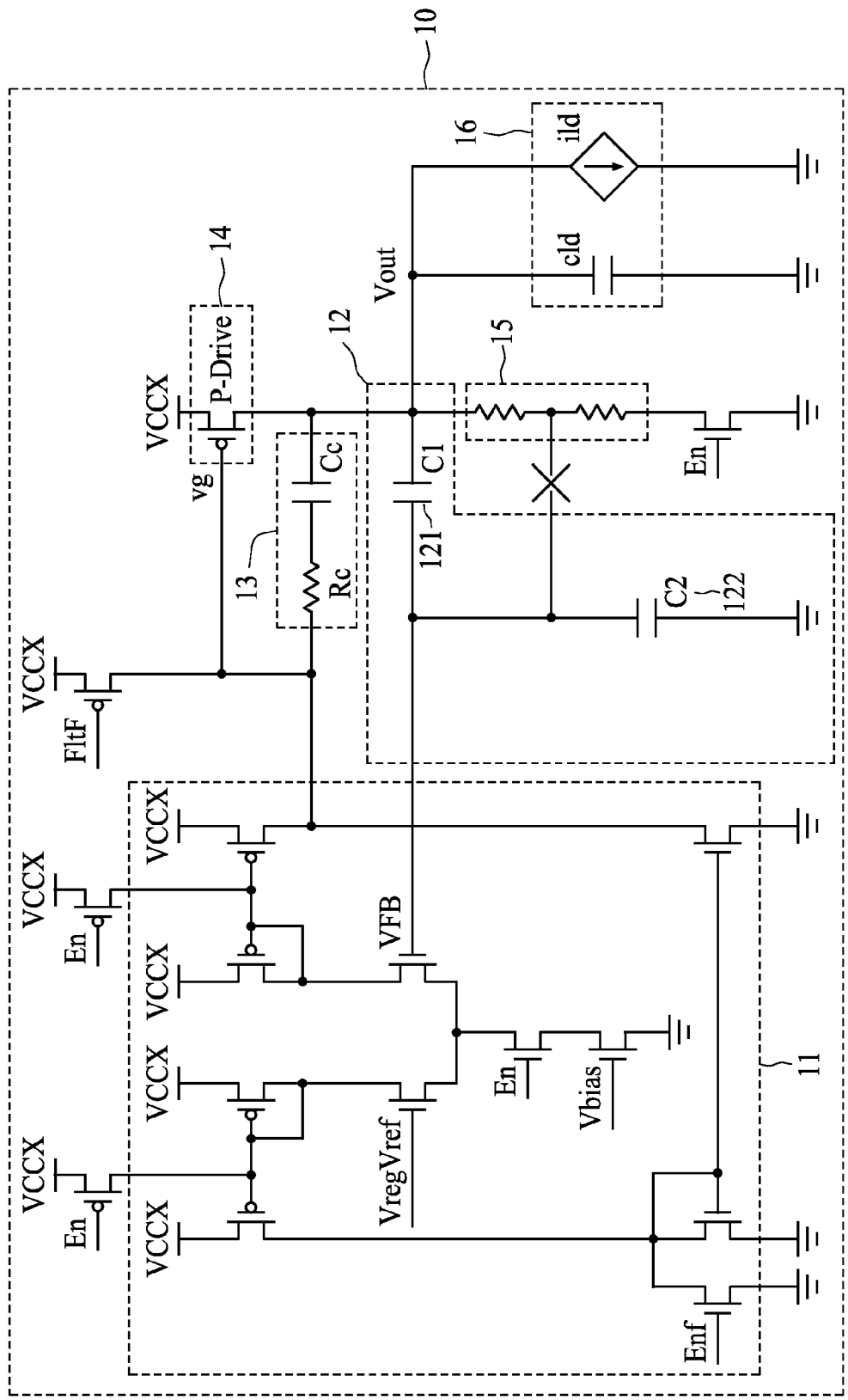
FIG. 3 shows an equivalent circuit of the voltage regulator during the non-enable mode according to another embodiment of the present invention.

FIG. 3 shows an equivalent circuit of the voltage regulator 10 during the non-enable mode according to another embodiment of the present invention. As shown in FIG. 3, during the non-enable mode, the second transistor 123 and the third transistor 125 are turned off, and the first transistor 124 is turned on. During the non-enable mode, the first capacitor 121 and the second capacitor 122 are coupled to the input terminal VFB of the error amplifier 11. The voltage of VFB can be set to $$V_{VFB}=V_{out}*C1/(C1+C2).$$

The value of C1/(C1+C2) can be modified to adjust the voltage of VFB close to VregRef.

The non-enable mode is used during the power down mode, where the $V_{VFB}$ is close to VregRef. The two inputs of the error amplifier 11, VregRef and VFB, have similar voltages. This allows the voltage regulator 10 to remain in power down mode longer, thereby reducing power consumption.

The enable mode is used during the normal operation, while the non-enable mode is used during power down mode. The present invention can improve transient results of a step response to switch from the non-enable mode to the enable mode without extra power dissipation or large layout size penalty compared to the previous structure.

During the enable mode with feedback compensation, the first capacitor 121 and the voltage divider 15 can improve the transient result of a continuous response just as the circuit can improve frequency response and reduce voltage drop during normal operation.

In brief, the feedback resistors and capacitors compensate the frequency response of the voltage regulator. By turning the transistors on or off, the voltage regulator can switch between the enable mode and the non-enable mode so as to reduce the Miller Effect and add a compensation path between the output voltage Vout and the feedback input VFB, which improves the continue response and reduces the voltage drop.

Although the present invention and its advantages have been described in detail, it should be understood that various changes, substitutions and alterations can be made herein without departing from the spirit and scope of the invention as defined by the appended claims For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A voltage regulator, comprising:
an output drive device configured to provide an output voltage to an output terminal;
an error amplifier configured to control the output drive device by taking into consideration a feedback signal from the output voltage;
a first compensation unit configured to provide a first compensation signal to compensate an output signal of the error amplifier;
a second compensation unit configured to provide a second compensation signal to compensate an input signal of the error amplifier, wherein second compensation unit comprises at least two capacitors and at least one transistor configured to control the coupling of the two capacitors; and
a voltage divider configured to divide the output voltage into a feedback voltage during an enable mode; and
a second transistor configured to couple the feedback voltage to the input terminal of the error amplifier.

2. The voltage regulator of claim 1, wherein the error amplifier is an operational transconductance amplifier (OTA).

3. The voltage regulator of claim 1, wherein the first compensation unit comprises a resistor and a capacitor in series.

4. The voltage regulator of claim 1, wherein the second compensation unit comprises:
a first capacitor connecting the output terminal of the output drive device and an input terminal of the error amplifier; and
a first transistor configured to couple a second capacitor to the input terminal of the error amplifier during a non-enable mode.

5. The voltage regulator of claim 1, wherein the first transistor and the second transistor operate complementarily.

6. The voltage regulator of claim 4, wherein the second compensation unit further comprises a third transistor configured to couple the second capacitor to the ground during the enable mode.

7. The voltage regulator of claim 6, wherein the first transistor and the third transistor operate complementarily.

* * * * *